United States Patent Office 3,060,018
Patented Oct. 23, 1962

3,060,018

GOLD BASE ALLOY

Timothy J. Desmond, Kokomo, Ind., assignor to General Motors Corporation, Detroit, Mich., a corporation of Delaware No Drawing. Filed Apr. 1, 1960, Ser. No. 19,188
3 Claims. (Cl. 75—165)

This invention relates to making semiconductor devices and more particularly to a composition which facilitates the formation of electrical contacts on semiconductor bodies.

Signal translating devices such as rectifiers and transistors can be made from semiconductor bodies such as germanium and silicon. Semiconductor bodies forming signal translating devices have at least two regions of different conductivity type. These two regions are separated by a rectifying barrier or p-n junction. Transistors have two p-n junctions which are separated by a thin intermediate or base region. In a transistor minority conduction carriers are released into the base region at one p-n junction and migrate by diffusion to the second p-n junction to change its conductivity characteristics. By this mechanism electrical signals can be generated, amplified or translated.

An n-type or p-type semiconductor is formed by introducing a suitable impurity into the crystal structure of the semiconductor. The impurity which induces the pure semiconductor material to exhibit n-type or p-type conductivity or converts an area of a semiconductor from one conductivity type to another is frequently referred to as a "dopant." An area of an n-type semiconductor can be transformed into p-type, forming a p-n junction, by applying a suitable dopant to the surface of the semiconductor and alloying it therewith.

It is often preferred to make ohmic and rectifying contacts on a semiconductor by initially making a preform of the electrode and suitably attaching the electrode to the semiconductor. In making a rectifying contact in which n-type germanium or silicon is desired to be converted into p-type to form a p-n junction, the material comprising the preformed electrical contact should, of course, be made of or contain a suitable element from group III–A of the periodic table of elements. Although aluminum can be used to form a rectifying contact in this manner, aluminum suffers from the inherent disadvantage in that it tends to non-uniformly wet the surface of the semiconductor. Such a characteristic is not only conducive to the formation of strained junctions but also presents difficulties in soldering an electrical lead to the contact.

Of the other elements of group III–A boron, having a much higher segregation coefficient than aluminum, would be much more desirable for making rectifying contacts. Unfortunately the characteristics of boron are not favorable for the satisfactory commercial use of elemental boron in making preformed contacts to germanium and silicon.

In some instances it is preferred to alloy a particular dopant with a carrier metal to form a rectifying electrical contact. An excellent carrier metal for this purpose is gold. A gold alloy, as referred to herein, would be an alloy containing more than 50%, by weight, gold. Gold not only wets silicon and germanium very well but also forms a low melting eutectic therewith. In addition, gold resists attack by the etchants used to clean up the transistor after fabrication and presents a readily solderable surface. Thus, if gold is employed there is no necessity to mask the gold surfaces during clean up, eliminating an expensive processing step in the fabrication of the semiconductor. A boron-gold alloy would be especially satisfactory to use in making rectifying contacts with n-type silicon or germanium, particularly those of a peculiar geometric configuration which require the use of a preform. However, boron is relatively insoluble in gold and for this reason a gold-boron alloy cannot be used. A silicon-boron alloy can be made but this alloy does not have the necessary characteristics which permit easy fabrication of extremely thin, small preforms required. A gold-silicon-boron alloy can be used but is unsatisfactory as it tends to non-uniformly "wet" the semiconductor giving undesirable variations in alloy depth.

It is an object of my invention to provide a semiconductor device having electrical contacts made of a boron-containing material. It is another object of the invention to provide a method of making a rectifying contact on a semiconductor body utilizing a gold-nickel-boron alloy preform.

Among other objects of the invention is the provision of a new material which can be used to facilitate the formation of electrical contacts on a semiconductor. Further objects, features and advantages of the invention will become more apparent from the following description of preferred embodiments thereof.

Comprehended by my invention is a semiconductor device having an electrical contact formed of a ductile and malleable gold-nickel-boron alloy. Such an alloy has the physical properties which permit simple and economical commercial production of the small, exceedingly thin preforms required for electrical contacts of special configuration. The gold-nickel-boron alloy not only has essentially the same solubility for silicon or germanium as does pure gold but uniformly wets the surface of the semiconductor permitting better control of alloying and greater uniformity of the resultant product. An electrode made in accordance with my invention presents a readily solderable surface and can not only be used to make a rectifying electrical contact on an n-type semiconductor, such as silicon or germanium, but also to make an ohmic contact on the p-type semiconductor.

Although boron is relatively insoluble in pure gold, comparatively large amounts of boron can be associated with gold in combination with nickel. The characteristics of an alloy containing gold, nickel and boron, for purposes of making electrical contacts on semiconductors, are essentially the same as those of pure gold. I prefer to form my gold-nickel-boron alloy generally in two steps; the first of which involves the formation of a pre-alloy of nickel and boron and the second of which involves mixing the pre-alloy with gold at a suitable alloying temperature.

The pre-alloy of nickel and boron can be formed by heating nickel sheet or powder with amorphous boron in an inert atmosphere such as nitrogen, helium, argon or the like. The mixture is heated to a suitable temperature at which the mixture becomes molten for a sufficient duration to alloy the nickel and boron. The molten metals are thoroughly mixed to obtain an alloy of uniform composition. The alloy, thus formed, is quenched as by the transfer to a stainless steel water cooled vessel.

The temperature at which the alloying of the nickel and boron can be accomplished is somewhat variable. Although I prefer to perform the alloying at a temperature of about 1200° C.–1300° C., lower temperatures can be used. A temperature of at least above about 990° C. must be employed, depending upon the composition of the pre-alloy desired. A nickel-boron eutectic of the pre-alloy contains 13% boron and 87% nickel, all proportions by weight, melting at about 990° C.

The duration of the heating is no more material to the preparation of the pre-alloy as it is to the formation of any alloy. In general, the heating must be of a sufficient duration to permit complete combination of the metals and formation of an alloy of uniform composition. Satisfactory results are obtained by agitating the molten metals for several minutes.

The solid nickel-boron alloy is extremely brittle and is preferably crushed into powdered form to facilitate accurate proportioning with gold. A pre-alloy which has been crushed into a powder which will pass a 200 mesh screen can be satisfactorily used. The powdered alloy is added to the desired amount of gold and the resulting mixture is heated in an inert atmosphere, such as described above. The mixture is preferably heated at a temperature of at least 1070° C. for a sufficient duration to blend the various metals into an alloy of uniform composition. I generally prefer to use a temperature of about 1100° C. to 1200° C. Several minutes agitation of molten metals is generally sufficient to obtain satisfactory blending.

After blending the metals to form my gold-nickel-boron alloy, the alloy is quenched by pouring it into a water cooled stainless steel container. The resultant alloy is both malleable and ductile and alloys with silicon and germanium at about as low a temperature as pure gold. The resultant alloy is thus suitable for any further treatment required to make a preform of an electrode. The alloy can easily be rolled into thin sheets, punched, etc.

The amount of boron preferably used in my gold alloy is variable to some extent, depending on a number of factors. A primary consideration involved is whether the alloy is to be used in making an ohmic contact or a rectifying contact. Although contacts can be made with pure gold, resistivity modulation may be effected by making an ohmic contact on a p-type semiconductor with an alloy containing even small but effective amounts of a p-type dopant. At least about 0.01% boron is required in most instances to have an appreciable effect. Larger amounts of boron are preferred when making a rectifying contact with an n-type silicon or germanium crystal. For most purposes I prefer to make a rectifying contact utilizing a gold-nickel-boron alloy containing from 0.01% to 0.13%, by weight, boron. For some purposes it may be desired to have an even higher proportion of boron.

As I prefer to form my gold-nickel-boron alloy using a pre-alloy of nickel and boron, the preferred amount of nickel therein is not only dependent upon the amount of boron desired in my alloy but also the amount of boron present in the pre-alloy.

An eutectic mixture of nickel and boron is formed using 13% boron and 87% nickel. This composition not only has a satisfactory solubility in gold but also has a comparatively low melting point, 990° C. When using a pre-alloy of this composition it is used in amounts of 0.1%, by weight, even in forming ohmic contacts. For rectifying contacts highly satisfactory results can be attained with a gold alloy containing between about 0.5% and 1%, by weight, of this pre-alloy.

Although nickel-boron alloys having lesser amounts of boron than 13% also are miscible with gold, such alloys not only must be formed at higher temperatures but greater amounts of these alloys must be employed to attain the same proportion of boron to gold in the resultant gold-nickel-boron alloy. Nickel-boron alloys containing 15% through 18% boron are commercially available and, for this reason, may be preferred in some instances.

The amount of nickel in my gold-nickel-boron alloy can also be varied. Primarily the amount of nickel present depends upon the amount of boron used in the pre-alloy and the amount of boron desired in the resultant gold alloy. As a general rule, however, the nickel content in the gold-nickel-boron alloy of my invention is at least about five times greater than the amount of boron present therein with the balance being gold. For most purposes a satisfactory gold alloy for semiconductor electrical contacts would contain in excess of about 95%, by weight, gold.

To make a rectifying contact on a semiconductor of n-type silicon or germanium, a wafer of the semiconductor is prepared in the usual manner. For example, a wafer of n-type silicon is lapped with a #600 grit such as boron carbide or silicon carbide. The lapped silicon is then etched as by immersion in the commercially available CP4 etchant or an equal mixture of concentrated hydrofluoric acid, concentrated nitric acid and glacial acetic acid. After etching, the wafer is rinsed in methyl alcohol and dried. The wafer and the preformed electrode are then assembled and heated in a nitrogen atmosphere at about 400° C. to 500° C. for a sufficient duration to obtain the desired diffusion of the alloy into the crystal. After a suitable duration the crystal is slowly cooled in the customary manner used when alloying pure gold to the semiconductor body. For example, the semiconductor can be cooled in the protective atmosphere at a rate of approximately 5° C. to 10° C. per minute.

The temperature at which my gold alloy is diffused into the silicon or germanium is slightly above the silicon-gold or germanium-gold eutectic temperature. In this manner a solid-solid diffusion can occur maintaining the geometry of the preform while permitting intimate contact and wetting of the semiconductor surface to produce a rectifying contact. In general, the same alloying techniques can be employed using the alloy of my invention as are customarily employed when securing pure gold ohmic contacts to the same semiconductor body.

It is understood, of course, that although my invention has been described in connection with certain specific examples, variations on the basic concepts of my invention can be made without departing from the spirit thereof. Such variations are understood to be encompassed within the scope of the appended claims. For example, the principles of my invention can be utilized in forming a useful sintered powdered metal product, such as a preformed semiconductor electrode. In such instance a mixture of the powdered boron-nickel pre-alloy and powdered gold in proportions such as previously disclosed herein, compacted under sufficient pressure and sintered at about 200° C., yields a sintered material analogous to the alloy previously described herein. The sintered product formed in this manner contains an alloy of gold, boron and nickel such as is encompassed in the appended claims. Other variations of powdered metal products can also be analogously formed.

I claim:

1. A gold alloy consisting essentially of about 0.01%–0.13% boron, at least about 0.5% nickel and at least about 95% gold, all proportions by weight.

2. A gold alloy consisting essentially of at least about 0.01%, by weight, boron, at least about 0.05%, by weight, nickel and at least about 95%, by weight, gold.

3. A rectifying contact on a semiconductor signal translating device, said contact formed of an alloy consisting essentially of about 0.01%–0.13%, by weight, boron, at least about 0.05%, by weight, nickel and at least about 95%, by weight, gold.

References Cited in the file of this patent

UNITED STATES PATENTS

| | | |
|---|---|---|
| 1,339,009 | Van Allen | May 4, 1920 |
| 1,340,451 | Koch | May 18, 1920 |
| 1,577,995 | Wise | Mar. 23, 1926 |
| 2,168,129 | Leverick | Aug. 1, 1929 |
| 2,189,640 | Powell | Feb. 6, 1940 |
| 2,856,320 | Swanson | Oct. 14, 1958 |
| 2,887,415 | Stevenson | May 19, 1959 |
| 2,887,417 | Blanks | May 19, 1959 |
| 2,944,891 | Cape | July 12, 1960 |